United States Patent
Hanners et al.

[11] Patent Number: 6,078,187
[45] Date of Patent: *Jun. 20, 2000

[54] HEMISPHERICAL TEST HEAD FOR INTEGRATED CIRCUIT TESTER EMPLOYING RADIALLY DISTRIBUTED CIRCUIT CARDS

[75] Inventors: John C. Hanners, Brentwood; Charles A. Miller, Fremont, both of Calif.

[73] Assignee: Credence Systems Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/013,753

[22] Filed: Jan. 27, 1998

Related U.S. Application Data

[63] Continuation-in-part of application No. 08/862,596, May 23, 1997.

[51] Int. Cl.[7] .................................................. G01R 31/02
[52] U.S. Cl. ........................... 324/761; 324/754; 324/765
[58] Field of Search .................................... 324/754, 755, 324/758, 760, 761, 765; 165/80.3, 80.4, 80.5; 361/688, 689, 690, 692, 693, 694, 695, 702, 714, 718

[56] References Cited

U.S. PATENT DOCUMENTS

| | | | |
|---|---|---|---|
| 4,517,512 | 5/1985 | Petrich et al. | 714/724 |
| 5,060,111 | 10/1991 | Takashima | 361/695 |
| 5,747,994 | 5/1998 | Suga | 324/158.1 |
| 5,834,946 | 10/1998 | Albrow et al. | 324/760 |

*Primary Examiner*—Josie Ballato
*Assistant Examiner*—Russell M Kobert
*Attorney, Agent, or Firm*—Daniel J.. Bedell; Smith-Hill and Bedell

[57] ABSTRACT

A test head for an integrated circuit tester includes a set of wedge-shaped node cards, one for each terminal of the integrated circuit device under test (DUT). Each node card holds circuits for carrying out all test activities at one DUT terminal including generating and transmitting a test signal to the DUT and receiving and processing a response signal produced by the DUT. The test and response signals pass through an I/O terminal at a narrow end of the node card. A card frame having hemispherical inner and outer shells holds the node cards substantially therebetween with the I/O terminal of each card protruding through an aperture in the inner shell. A centroid distributor having substantially a hemispherical shaped surface nesting within the inner shell of the card frame holds a set of first terminals in contact with the node card I/O terminals. A set of conductors within the centroid distributor interconnect each first terminal with a corresponding second terminal on a flat surface of the distributor. A load board assembly holds the DUT and a connector assembly links each second terminal of the centroid distributor to a contact on the load board providing access to a DUT terminal. A pump evacuating air from a space between the inner shell of the card frame and the centroid distributor draws cooling air across the node cards.

24 Claims, 8 Drawing Sheets

HEMISPHERICAL TEST HEAD FOR INTEGRATED CIRCUIT TESTER EMPLOYING RADIALLY DISTRIBUTED CIRCUIT CARDS

CROSS-REFERENCE TO RELATED APPLICATIONS

The present application is a continuation-in-part of copending application Ser. No. 08/862,596, filed May 23, 1997 now pending.

BACKGROUND OF THE INVENTION

1. Field of the Invention

The present invention relates in general to equipment for automatically testing electronic circuits and in particular to a test head structure for holding components of a per-pin integrated circuit tester.

2. Description of Related Art

An integrated circuit tester applies patterns of logic signals to input terminals of an integrated circuit (IC) and acquires the resulting logic signal patterns produced at its output terminals. Testers typically include a separate "pin electronics" circuit for each IC terminal. During each cycle of a test, a pin electronics circuit can, for example, send a high or low logic level test signal to the pin, sample an IC output signal at the pin and store data indicating its logic level, or do nothing. The action each pin electronics circuit takes during a given test cycle is controlled by the value of input data (a "test vector") supplied thereto at the start of the cycle. A test vector may also include timing data that tells the pin electronics circuit when to carry out the action during the test cycle.

Early IC testers employed a central addressable memory storing a large word at each address, each word being formed by all of the vector data needed for every pin electronics circuit for a particular test cycle. Thus, for example, if an IC had 8 terminals and a tester employed 8-bit vector data words, a 64-bit word was stored at each vector memory address. The vector memory was sequentially addressed so that it read out a next word during each test cycle. The eight vectors contained in the read out word were concurrently distributed to the pin electronics circuits by a large star bus. Thus a vector memory for a test spanning one million test cycles stored one million 64-bit words at successive addresses.

As the size and complexity of IC's increased, so too did the number of terminals on an IC; some IC's now have hundreds of pins. Due to the large number of parallel buses needed to transmit the vectors concurrently to the pin electronics, the use of a centralized vector memory has become impractical. U.S. Pat. No. 4,862,067 issued Aug. 29, 1989 to Brune et al describes a "per pin" integrated circuit tester in which vector storage memory is distributed to the tester nodes. Brune's tester includes a central address generator and a set of tester nodes, one node for each terminal of a device under test (DUT). Each node includes a vector memory for storing a sequence of test vectors, one for each cycle of the test. During a test the central address generator successively increments the address of the test vector memories of all nodes prior to the start of each test cycle so that each test vector memory reads out a new test vector and delivers it to the node's pin electronics at the beginning of each test cycle. In Brune's IC tester, all vector memories are linked to the host computer via a common bus through which the host computer loads vectors into the vector memories before the test. Thus the prior art multiplicity of vector buses leading from a central vector memory to all tester nodes is replaced by a single computer bus linking a host computer to distributed vector memories. While Brune's system reduces the amount of wiring in a tester, it increases the time required to program the tester. Since each vector memory must store one vector for each cycle of the test, the number of vectors that must be distributed to the vector memories can be so enormous that band width limitations on the computer bus greatly limit the speed with which an IC tester can be programmed for a test.

A tester system may reduce the amount of data that must be distributed to the tester nodes by distributing algorithmic instructions for generating vectors instead of the vectors themselves. In such a system, each node includes an instruction processor for generating the vectors during the test based on the locally stored instructions. Integrated circuit testers typically carry out repetitive patterns of actions at various IC terminals at various times during a test. Thus a set of instructions for generating a sequence of vectors including repeating patterns may require less storage space than the sequence of vectors itself. U.S. Pat. No. 4,994,732 issued Feb. 19, 1991 to Jeffery et al describes a per-pin tester which distributes some instruction processing capability to the nodes. In Jeffery's tester, only the first instance of a vector pattern is stored in the vector memory along with a loop instruction indicating the length of the pattern and the number of times a pattern is to be repeated. Each node of a tester includes an instruction processor which sequentially reads vectors out of the vector memory and supplies them to the pin electronics during successive test cycles. When the vector memory controller encounters a loop instruction, it repeats the pattern the indicated number of times. Thus the number of vectors needed to be sent to and stored in a vector memory before a test is reduced.

Signal delay becomes problematic when we employ distributed instruction processors in a large circuit tester. Signal delay is critical when testing an integrated circuit because test activities at all nodes must be precisely coordinated. For example, a test signal sent to an IC input terminal may engender a response in an IC output signal at an IC output terminal. A tester should be able to measure the output signal response at the output terminal at the end of a precisely timed interval following application of the test signal to the input terminal. As we increase the complexity of the tester nodes, we also increase the physical size of the nodes and it becomes more difficult to keep all nodes close to the device under test. As the distance between an IC terminal and the tester node that services it increases, so too does the amount of time required for a test or response signal to travel between the IC terminal and the tester node. When testing high speed integrated circuits, this signal travel time becomes a significant portion of the apparent IC response time, thereby complicating tester programming and interpretation of test results.

U.S. Pat. No. 4,517,512 issued May 14, 1985 to Petrich et al describes a test head which holds pin electronics close to the device under test. In Petrich's test head, a set of circuit cards each containing pin electronics for four IC pins, are arrayed in a radial pattern about a vertical axis of a motherboard. The integrated circuit DUT is mounted on an interface board resting on top of the circular array of pin electronics cards. Test signal input/output terminals at the upper edges of the pin electronics cards connect to the interface board. The interface board delivers test signals from the pin electronics card input/output terminals to the device under test. Petrich's test head is designed to position the pin electronics cards close to the DUT so as to minimize distances between the pin electronics cards and the DUT.

Heat also becomes problematic when we attempt to closely pack distributed instruction processors in a large circuit tester. In Petrich's test head, a duct carries cooling air from a blower to an aperture in the center of the motherboard. The air passes over the pin electronics cards and carries the heat away.

While Petrich's test head brings the pin electronics close to the DUT and keeps the pin electronics cool, the number of pin electronics cards it can accommodate is limited by the allowable diameter of the circular array of pin electronics cards. To increase the number of pin electronics cards, it is necessary to increase the diameter of the circular array, thereby increasing the test signal path distance between the cards and the DUT. One could also increase density by placing pin electronics servicing more than four pins on each pin electronics card. However when a pin electronics card for only one IC terminal becomes defective, the entire pin electronics card must be replaced, thereby increasing repair costs. Also Petrich's test head does not provide easy access to the pin cards for maintenance and replacement. Finally, when the blower forces air into the test head, that air passes through the head where it is heated and then exits into the room containing the test head. The hot air emanating from the test head can be uncomfortable to operators and maintenance personnel in the vicinity of the test head.

What is needed is a test head structure for holding large numbers of nodes of a per-pin integrated circuit tester close to a device under test while keeping the nodes cool. The test head should provide ready access to pin electronics for maintenance, should cool the nodes without heating the area around the test head, and should require minimal amounts of cabling. The test head should also be highly modular so that the system can be sized for the IC being tested and easily expanded.

SUMMARY OF THE INVENTION

In accordance with one aspect of the invention, a test head for an integrated circuit tester includes a set of wedge-shaped node cards, one for each terminal of the integrated circuit device under test (DUT). Each node card holds circuits for carrying out all test activities at one DUT terminal including generating and transmitting a test signal to the DUT and receiving and processing a response signal produced by the DUT. Both the test and response signals leave and arrive at an input/output (I/O) terminal at a narrow end of the wedge-shaped node card.

In accordance with another aspect of the invention, the test head also includes a card frame having hemispherical inner and outer shells. Card guides hold the node cards substantially between the inner and outer shells with a wide end of each card protruding through an aperture in the outer shell and the I/O terminal at the narrow end of each card protruding through an aperture in the inner shell, such that the I/O terminals are radially distributed on a hemispherical surface at points substantially equidistant from the DUT.

In accordance with a further aspect of the invention, a centroid distributor, having substantially a hemispherically shaped surface, nests within the inner shell of the card frame. A curved portion of the surface of the centroid distributor holds a set of first terminals while a planar portion of the centroid distributor surface holds a set of second terminals. A set of conductors within the centroid distributor interconnect each first terminal with a corresponding second terminal. When a node card is installed in the card frame, its I/O terminal contacts one of the first terminals of the centroid distributor.

In accordance with yet another aspect of the invention, the test head also includes a load board for holding the DUT. The load board includes a set of contacts, each conductively linked to a separate one of the DUT terminals and holds these contacts parallel with the planar portion of the centroid surface. A connector assembly between the planar surface of the centroid distributor and the load board provides a signal path between each load board contact and a corresponding one of the second terminals of the centroid distributor. Thus the centroid distributor, the connector assembly and the load board together provide signal paths between the node card I/O terminals and the DUT terminals. The lengths of the conductors within the centroid distributor and/or traces on the load board are adjusted so that all signal paths between the I/O terminals and the DUT terminals are of substantially equal length.

The hemispherical arrangement of the wedge-shaped node cards allows them to be densely packed and positioned with their input/output terminals near and substantially equidistant from the DUT.

In accordance with a still further aspect of the invention, an air plenum extending through the outer and inner shells of the card frame opens into a space between the card frame's inner shell and the centroid distributor. With an air pump attached to the air plenum removing air from that space, replacement air passes through the apertures in the outer shell of the card frame, across the node cards, through the apertures in the inner shell of the card frame and into that space between the inner shell and the centroid distributor. As air passes over the node cards, it cools the tester circuits mounted thereon. The test head's air cooling system evenly distributes cooling air to the node cards, thereby helping to maintain the node cards at similar operating temperatures.

It is accordingly an object of the invention to provide a test head structure for holding large numbers of nodes cards of a per-pin integrated circuit tester close to a device under test while keeping the nodes uniformly cool.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
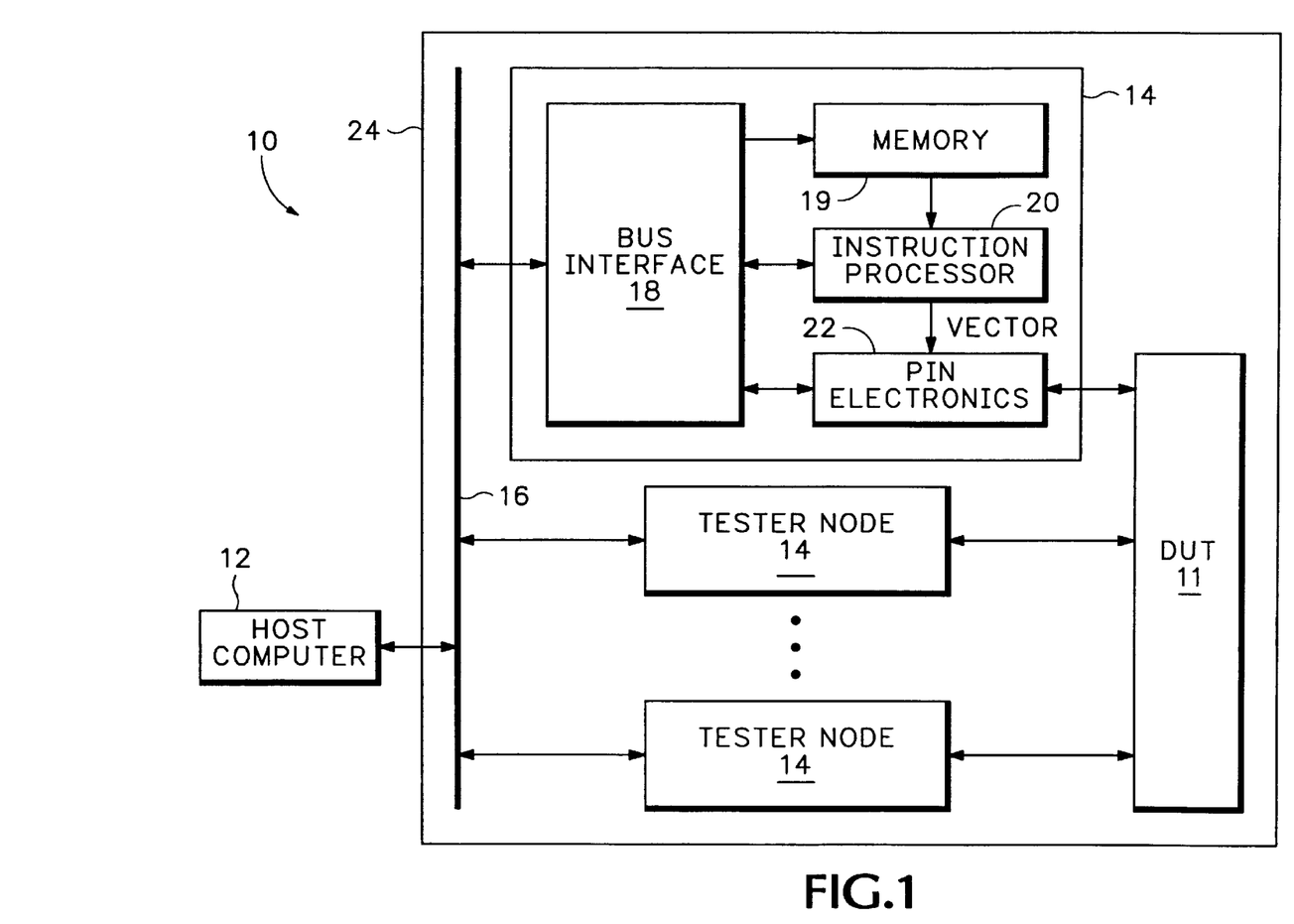
FIG. 1 is an electronic block diagram of a per-pin integrated circuit tester.

FIG. 1 is an electronic block diagram of a per-pin integrated circuit tester 10 for testing an integrated circuit device under test (DUT) 11. Tester 10 includes a host computer 12 connected to a set of tester nodes 14 via a bus 16. Each tester node 14 includes a bus interface circuit 18, a memory 19, an instruction processor 20, and a pin electronics circuit 22. During a test of DUT 11, the pin electronics circuit 22 of each tester node 14 carries out all test activities with respect to a corresponding terminal of DUT 11. For example at various times during a test, a pin electronics circuit 22 may transmit a test signal of a particular logic level to the DUT terminal or may sample the state of output signal produced by DUT 11 at the DUT terminal and store data indicating the results in internal acquisition memories. The actions of the pin electronics circuit 22 of each node 14 are controlled by an input sequence of data (test vectors) produced by the node's instruction processor 20 in response to a sequence of instructions it reads out of memory 19. Host computer 12 writes the instructions into the memory 19 of each node 14 before the test via bus 16 and bus interface circuit 18. To initiate the test, host computer 12 sends a start signal to all instruction processors via bus 16 and bus interface circuit 18. During the test, each instruction processor 20 reads instructions out of its local memory 19 and executes the instructions to generate vectors supplied to the local pin electronics circuits 22. After the test, host computer 12 reads acquired test data out of acquisition memories within pin electronics circuits 22, also via bus 16 and bus interface circuit 18.

The design and operation of the electronic aspects of an integrated circuit tester of the type illustrated in FIG. 1 is well-known and not further detailed herein. For example, U.S. Pat. No. 4,994,732 issued Feb. 19, 1991 to Jeffery et al, incorporated herein by reference, describes a similar per-pin integrated circuit tester.

The present invention relates primarily to the mechanical structure of a test head 24 on which tester nodes 14 and DUT 11 are mounted. Each tester node 14 is implemented on a separate printed circuit board, and test head 24 is designed to hold tester nodes 14 close to DUT 11 and to provide signal paths between terminals of DUT 11 and pin electronics circuits 22 of tester nodes 14 that are short and of uniform length. Short, uniform signal paths minimize the time required for test signals to travel between pin electronics circuit 22 and terminals of DUT 11. Short signal paths are also less susceptible to noise.

Test head 24 is also designed to keep electronics implementing tester nodes 14 cool and at a uniform temperature. Since each tester node 14 includes its own memory 19, instruction processor 20 and other circuits, each node 14 radiates heat. For example, when tester 10 includes 300 tester nodes 14, each radiating 5–15 watts, nodes 14 of test head 24 in total radiate 1500–4500 watts. Since tester nodes 14 are clustered as close as possible to DUT 11, nodes 14 generate a lot of heat in a small space. Various structural features of test head 24 as described herein provide for rapid removal of that heat.

Figure 2:
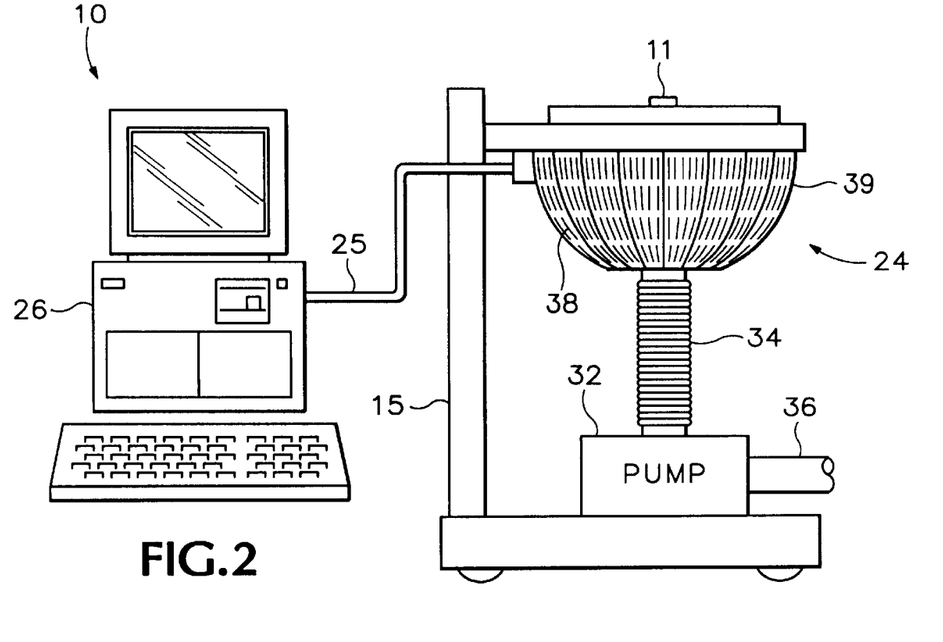
FIG. 2 is a pictorial representation of the integrated circuit tester of FIG. 1, FIGS. 3A and 3B are plan views of the front and reverse sides of a node card implementing a test node of FIG. 1.

FIG. 2 is a pictorial representation of the integrated circuit tester 10 of FIG. 1. Computer 12 of FIG. 1, contained in a console 26, is connected to test head 24 via a cable 25 including bus 16 of FIG. 1 and conductors delivering 48-volt power to test head 24 from a power supply within console 26. A conventional manipulator base 15 supports test head 24. A vacuum pump 32 connected to test head 24 via a flexible duct 34 draws warm air from test head 24 and exhausts it away from test head 24 via an exhaust pipe 36. Cooling air enters test head 24 via a set of apertures 38 in its cover 39.

Node Cards

Figure 3A:
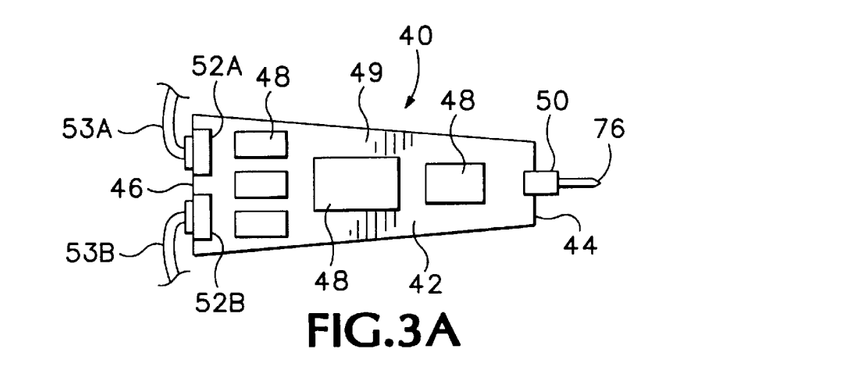
Figure 3B:
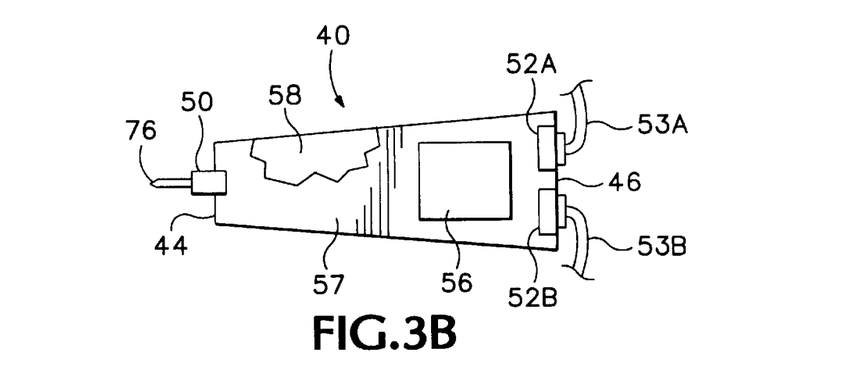
Figure 4:
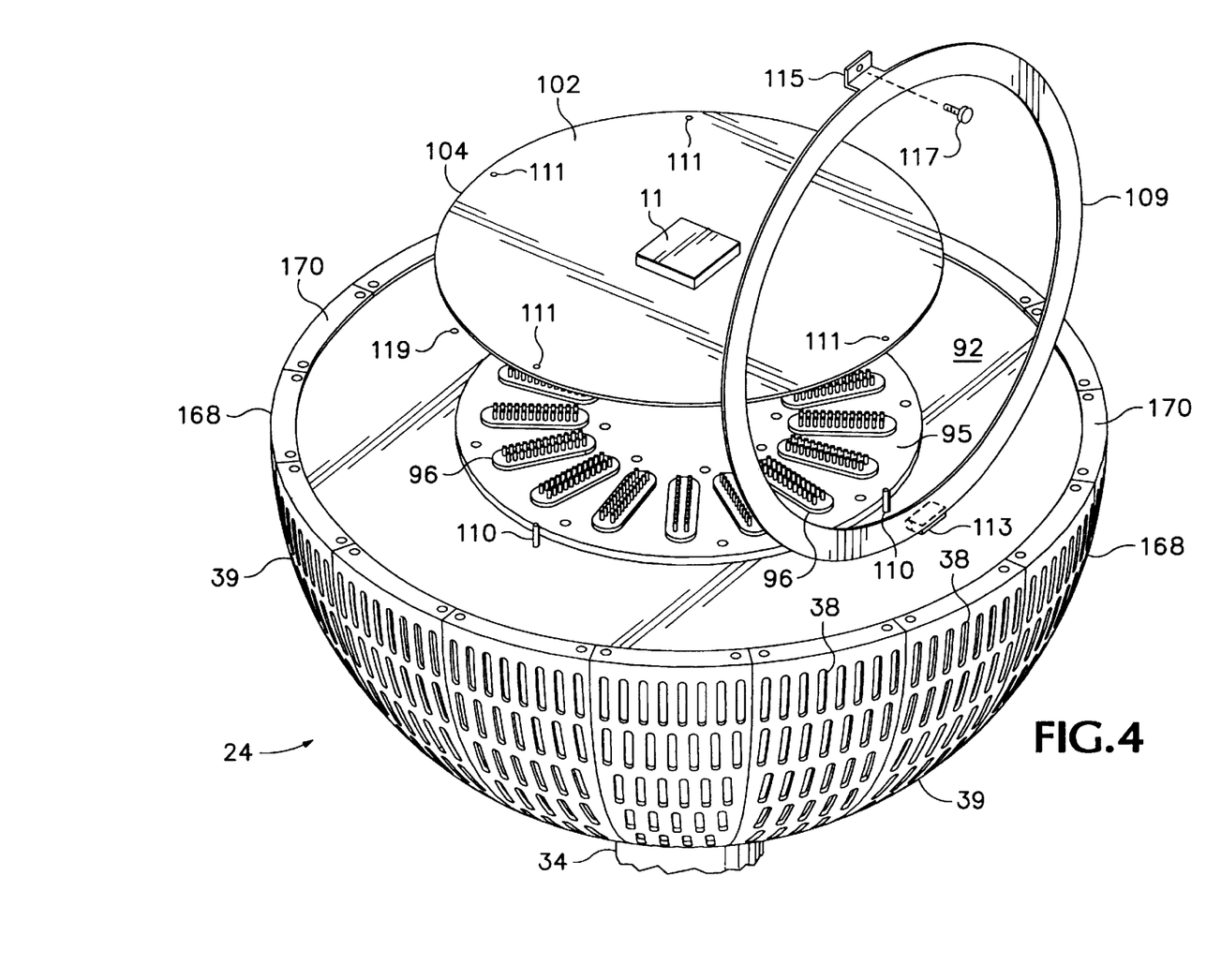
FIG. 4 is a perspective view of a test head for an integrated circuit tester in accordance with the present invention.

Each node 14 of FIG. 1 is implemented within test head 24 of FIG. 2 by a separate "node card" 40 as illustrated in FIGS. 3A and 3B. Each node card 40 includes a wedge-shaped printed circuit board 42 having a narrow end 44 and a wide end 46. A set of integrated circuits 48 implementing a node 14 of FIG. 1 are mounted on a front surface 49 of circuit board 42. The node transmits its output test signal to the DUT and receives an input response signal from the DUT through an input/output (I/O) terminal 50 and a pogo pin 76 connector mounted on the narrow end 44 of circuit board 42. Bus 16 of FIG. 1, a 48 volt power line and a ground line are carried by cables that jumper from node card to node card. A pair of cable connectors 52A and 52B mounted on the wide end 46 of card 40 receive incoming and outgoing bus and power cables 53A and 53B. A power converter circuit 56 mounted on a back surface 57 of circuit board 42 converts the 48 volt power arriving at connector 52A to various DC operating voltages required by integrated circuits 48. A conductive ground plane 58 sandwiched between front and back surfaces 49 and 57 shields circuits 48 from noise generated by power converter 56. Conductive microstrip traces (not shown) on the front and back surfaces 49 and 57 of circuit board 42 and vias through circuit board 42 appropriately interconnect integrated circuits 48, I/O terminal 50, connectors 52A and 52B and ground plane 58.

Test Head Structure

As illustrated in FIGS. 4–7, test head 24 includes a card frame 60 including a hemispherical inner shell 62 nested within a hemispherical outer shell 64. Outer shell 64 includes a set of apertures 68 through which node cards 40 may be inserted. A set of card guides 70 attached to inner and outer shells 62 and 64 hold each node card 40 in place with the wide end 46 of each card 40 extending through an aperture in outer shell 64 and the pogo pin I/O terminal 50 of node card 40 extending through an aperture in inner shell 62. Card frame 60 holds node cards 40 such that the pogo pin ends 76 of I/O terminals 50 are equidistant from a focal point 78 of inner shell 62 and outer shell 64.

A "centroid distributor" 80 is nested within, but spaced from, inner shell 62. Distributor 80 includes a curved (hemispherical) lower surface 82 holding a first set of contacts 84 for receiving pogo pin ends 76. Distributor 80 also includes a planar upper surface formed by a printed circuit board 86. A second set of contacts 88 extend through circuit board 86, and a set of coaxial cables 90 interconnect each first contact 84 with a corresponding second contact 88.

Card frame 60 and centroid distributor 80 are attached to the underside 89 of a circular base plate 92 having a set of apertures 94. A circular pogo pin assembly plate 95 containing a set of double-ended pogo pin connectors 96 is attached to the upper surface 93 of base plate 92. Each pogo pin connector 96 includes a set of lower pogo pins 98 extending downward through apertures 94 and onto distributor contacts 88. Each lower pogo pin 98 is linked to a corresponding upper pin 100 of a connector 96 so that signals may travel therebetween. DUT 11 is mounted on an upper surface 102 of a printed circuit load board 104. Each of a set of conductive pads formed on a lower surface 108 of load board 104 is connected to a separate terminal of DUT 11 through vias through load board 104 and a set of microstrip conductors also formed on the lower surface 108 of load board 104.

A flat ring 109 with its outer diameter slightly greater than the diameter of load board 104 and its inner diameter slightly less than the diameter of load board 104 is held in place centered over load board 104. The inner edge of ring 109 overlaps the outer edge of load board 104 and holds it in place on top of base plate 92. Ring 109 contains a hinge 113 opposite a screw plate 115 secured to base plate 92 with screw 117 fitting into screw hole 119 on base plate 92. A set of guide pins 110 extending upward from base plate 92 through holes 111 in load board 104 align load board 104 on base plate 92 so that the upper pins 100 of pogo pin connectors 96 contact pads 106 on the lower surface 108 of load board 104.

Signal Paths

A test signal produced on one of node cards 40 passes though its I/O terminal 50 via pogo pin 76 to one of contacts 84 embedded in the lower curved surface 82 of centroid distributor 80. One of coaxial cables 90 then delivers the test signal to one of contacts 88 on the printed circuit board distributor's upper surface 86. A lower pogo pin 98 of one of pogo pin connectors 96 conveys the test signal from the contact 88 to its corresponding upper pogo pin 100. The upper pogo pin 100 forwards the test signal to one of contact pads 106 on the lower surface 108 of load board 104. The test signal then travels from the contact pad 106 to a terminal of DUT 11 through microstrip traces and vias on load board 104. A DUT output signal produced at that DUT terminal travels the same path in the reverse direction back to the pogo pin I/O terminal 50 of the same node card 40.

Figure 6:
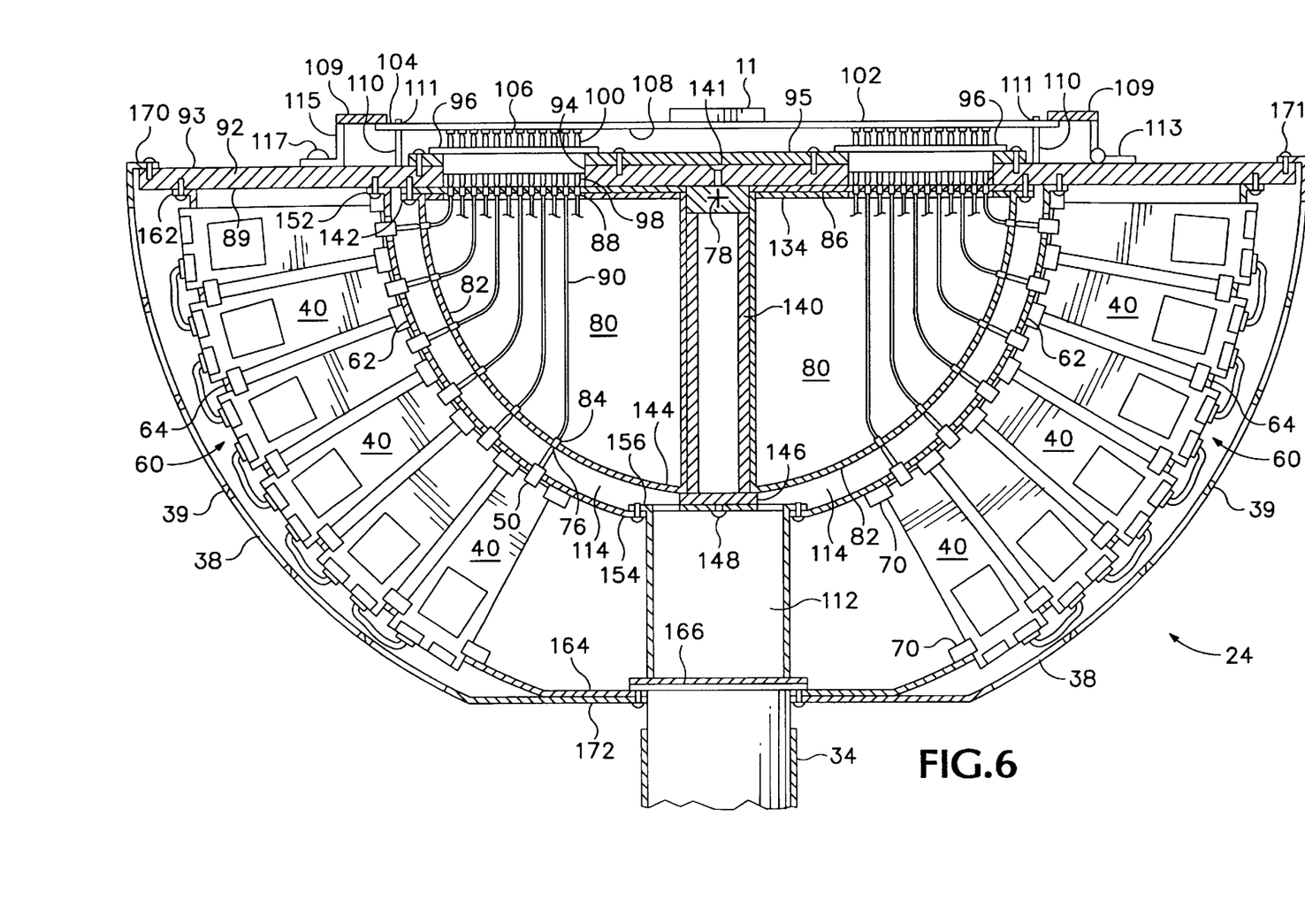
FIG. 6 is a sectional elevation view of the test head of FIG. 4.

It is desirable that signal paths between all node cards 40 and the DUT terminals they access be of uniform length. Although for simplicity coaxial cables 90 are shown in FIG. 6 as having varying lengths, all cables 90 could be of uniform length. If cables 90 are of uniform length, and if the microstrip conductors (not shown) on load board 104 which connect contact pads 106 with DUT 11 terminals are also of uniform length, then all signal paths between the pogo pin I/O terminals 50 of node cards 40 and DUT 11 terminals will be of uniform length. However, each coaxial cable 90 may be only as long as necessary to extend between a lower contact 84 and its upper contact 88 as illustrated in FIG. 6. In such case coaxial cables 90 would be of varying lengths. Therefore to ensure the signal paths between node cards 40 and DUT 11 terminals be of uniform length, the lengths of traces on load board 104 connecting contacts 106 to the DUT terminals should be suitably adjusted to compensate for differences in lengths of coaxial cables 90.

Cooling System

Since node cards 40 are densely packed it is necessary to actively remove heat generated by the integrated circuits 48 and power converter circuits 56 mounted on the node cards. A cylindrical air plenum 112 extending upward though outer shell 64 and inner shell 62 of card frame 60 opens into a plenum 114 formed by the space between card frame inner shell 62 and the hemispherical lower surface 82 of distributor 80. Duct 34 connects plenum 112 to air pump 32 of FIG. 2. When pump 32 draws air from plenum 114 via plenum 112 and duct 34, the vacuum created in plenum 114 draws cool outside air through apertures 38 in test head cover 39. That cool air then passes over and cools the integrated circuits 56 and 48 mounted on node cards 40. The hot air then enters plenum 114 to be thereafter evacuated by air pump 32 of FIG. 2.

Modular Test Head Construction

Figure 7:
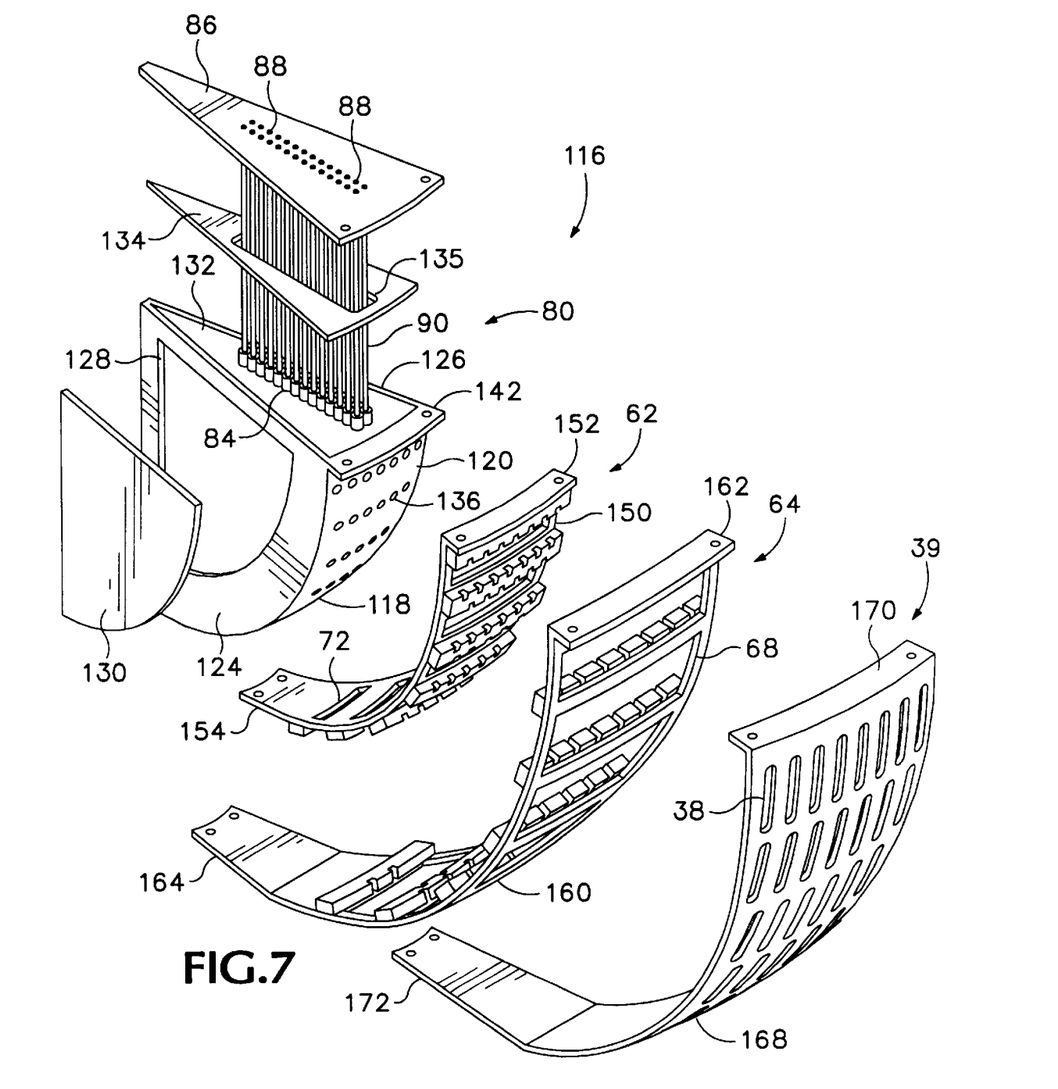
FIG. 7 is an exploded perspective view of a portion of the test head of FIG. 4.

In the preferred embodiment of the invention, centroid distributor 80 is formed by a set of hemispherical sections 116, one of which is illustrated in exploded view in FIG. 7. Each section 116 is in the shape of a hemispherical wedge so that when assembled together a set of sections 116 form the hemispherical centroid distributor 80. Each centroid section 116 includes a plastic case 118 having a curved surface 120 and planer right side (not shown), left side 124 and top side 126. Left side 124 has a large opening 128 for receiving a side cover 130. Top side 126 has an opening 132 for receiving a top cover 134. Printed circuit board 86 containing second contacts 88 is attached to the upper side of top cover 134. Ends of a set of coaxial cables 90 are tied to separate contacts 88 embedded in circuit board 86. First contacts 84 are attached to the other ends of cables 90 and extend through an opening 135 in top cover 134. An assembler, reaching through access hole 128, inserts contacts 84 into holes 136. With side cover 130 in place within opening 128, centroid section 116 is injected with epoxy to make section 116 rigid and to hold covers 130 and 134, conductors 90 and contacts 84 in place.

Inner card frame shell 62, outer card frame shell 64 and cover 39 are also formed by a set of wedge-shaped hemispherical sections 150, 160 and 168, one each of which is also illustrated in FIG. 7. Card guides 70 are glued to the outer surface of inner card frame section 150 and to the inner surface of outer card frame section 160. Inner card guide section 150 includes a set of apertures 72 through which pogo pins 76 of FIG. 3A extend. Outer card guide section 160 includes a set of apertures 68 through which wide end 46 of node cards 40 of FIG. 3A extend. Cover section 168 includes apertures 38 aligned with spaces between the node cards installed in card guides 70 so as to allow cooling air to enter the test head and pass between the node cards.

Figure 5:
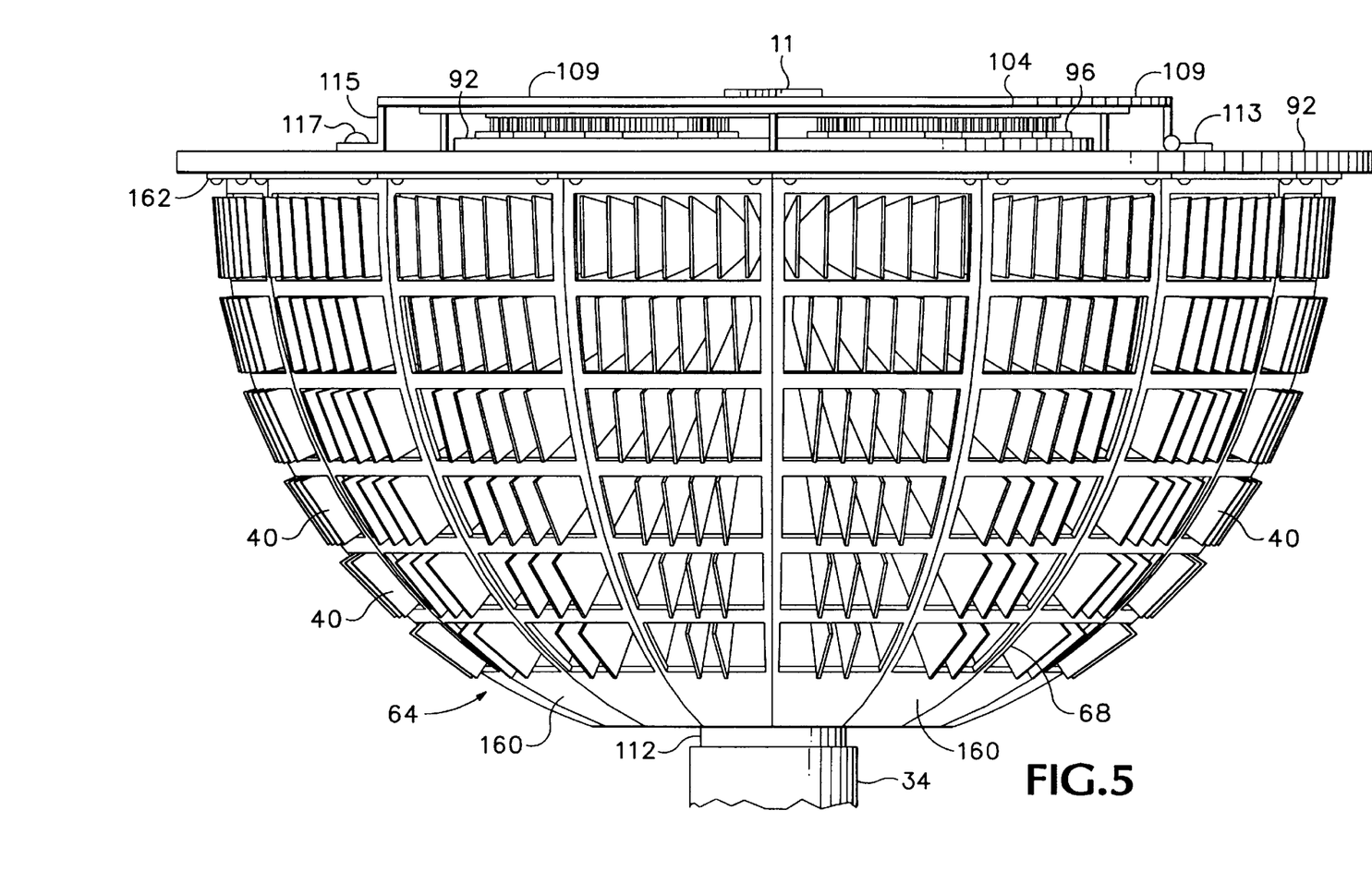
FIG. 5 is a side elevation view of the test head of FIG. 4 with its cover removed.

As best illustrated with reference to FIGS. 5 and 6, test head 24 is constructed by first attaching a central support column 140 to base plate 92 via a screw 141. Flanges 142 of centroid sections 116 are then screwed to the under side of base plate 92 with lower ends 144 of centroid distributor sections 116 fitting under a flange 146 forming a bottom end of support column 140. The cylindrical plenum 112 is then attached to support column 140 via a screw 148. With all sections 116 of centroid distributor 80 in place, each section 150 of inner shell 62 of card frame 60 is installed by screwing an upper flange 152 of the inner shell section 150 to base plate 92 and by screwing a lower end 154 of each section 150 to a flange 156 of plenum 112. Thereafter sections 160 of card frame outer shell 64 are installed by screwing an upper flange 162 of each section 160 to base plate 92 and by screwing a lower end 164 of each section 160 to a flange 166 of plenum 112. Node cards 40 are then installed in slots of card guides 70. Cables 53A and 53B are then connected to connectors 52A and 52B of node cards 40 of FIG. 3A. Sections 168 of test head cover 39 are then installed by screwing an upper flange 170 of each section 168 to base plate 92 via screw 171 and by screwing a lower end 172 of each cover section 168 to flange 166 of plenum 112. Pogo pin assembly plate 95 containing pogo pin connectors 96 is then screwed to the upper surface 93 of base plate 92 with lower pogo pins 98 contacting contacts 88 of centroid distributor 80.

Alternative Embodiment of Centroid Distributor

Figure 8:
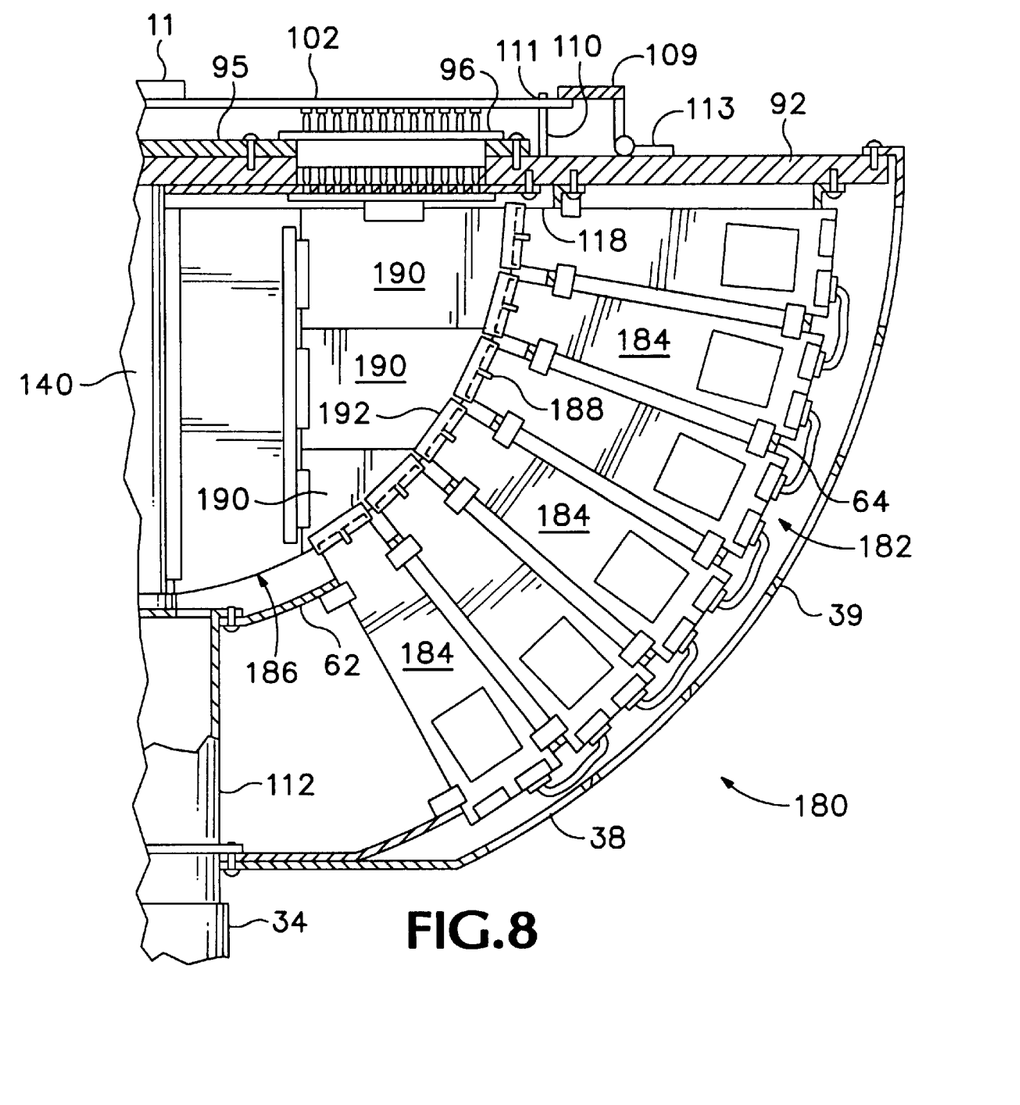
FIG. 8 is a partial sectional view of an alternative embodiment of the test head of FIG. 4.
Figure 9:
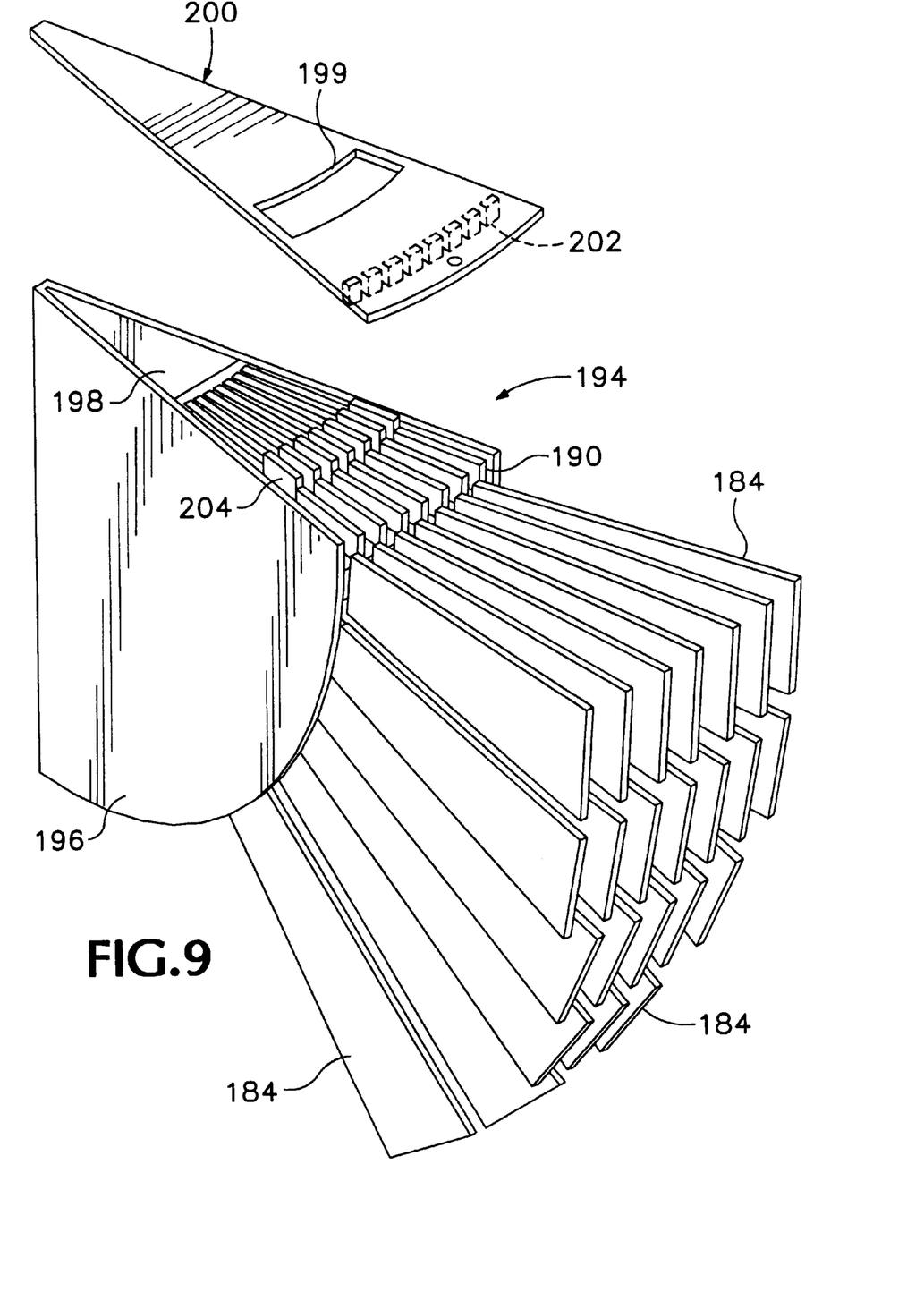
FIG. 9 is a perspective view of a portion of the centroid distributor of the test head of FIG. 4 with associated node cards installed therein.

In an alternative embodiment 180 of the test head as illustrated in FIGS. 8 and 9, a card frame 182 similar to card frame 60 of FIG. 6 holds a set of node cards 184 in a similar manner. Node cards 184, though generally similar to node cards 40 of FIGS. 3A and 3B, do not employ a pogo pin I/O terminal to make contact with the centroid distributor. Instead the I/O terminal on each node card 184 is simply a card edge contact 188 at the narrow end 118 of card 184 which plugs into an edge connector 192 on the lower surface of a centroid distributor 186. Edge connector 192 can be, for example, standard SMA, SMB or SMC types. In the alternative embodiment, centroid distributor 186 includes a set of printed circuit boards 190, each having one or more edge connectors 192 for receiving the end of a separate node card 184.

The hemispherical centroid distributor 186 is formed by a set of hemispherical wedges 194, one of which is illustrated in FIG. 9. Wedge 194 includes a plastic cover 196 including a slotted guide 198 for receiving edges of a set of printed circuit boards 190. Boards 190 are of varying sizes as needed to fill the available space within cover 196. Each circuit board 190 includes one or more female edge connectors 192 for receiving the ends of node cards 184 containing I/O terminal contacts 188. A top plate 200 covering wedge 194 includes a slotted card guide 202 for holding printed circuit boards 190 in place. A connector 204 on top of each printed circuit board 190 extends through an aperture 197 in top plate 200 and includes contacts to mate with lower pogo pins of a pogo pin assembly similar to assembly 96 of FIG. 6.

Thus has been described a test head structure for holding large numbers of nodes of a per-pin integrated circuit tester close to a device under test while keeping the nodes cool. The test head provides ready access to pin electronics for maintenance and cools the nodes. The test head is also highly modular so that the system can be sized to the IC being tested and easily expanded simply by inserting additional node cards.

While the foregoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for testing an integrated circuit device under test (DUT) having a plurality of DUT terminals by transmitting test signals to said DUT terminals and processing response signals produced by said DUT at said DUT terminals, the apparatus comprising:

a plurality of node cards, each node card corresponding to a separate one of said DUT terminals, each node card comprising an I/O terminal and circuit means connected to said I/O terminal for generating and transmitting a test signal from said I/O terminal and for receiving and processing a response signal arriving at said I/O terminal; and a card frame for holding said node cards such that their I/O terminals are radially distributed in three dimensions relative to each other at points substantially equidistant from a focal point.

2. The apparatus in accordance with claim 1 wherein each of said I/O terminals comprises a pogo pin.

3. The apparatus in accordance with claim 1 wherein each of said I/O terminals comprises a card edge contact.

4. The apparatus in accordance with claim 1 further comprising:

means for holding said DUT, and a plurality of conductive paths, each for conveying signals between a separate one of said DUT terminals and an I/O terminal of a corresponding one of said node cards for conveying test and response signals therebetween.

5. The apparatus in accordance with claim 4 wherein the conductive paths are of substantially equal length.

6. The apparatus in accordance with claim 1 further comprising:

a plurality of printed circuit boards, each circuit board having a curved edge following a path defined by points substantially equidistant from said focal point, and having a straight edge;

a plurality of first connectors each mounted on a curved edge of one said printed circuit boards, each first connector receiving the I/O terminal of a separate one of said node cards;

a plurality of second connectors, each mounted on said straight edge of one of said printed circuit boards;

a plurality of microstrip traces formed on said printed circuit boards, each microstrip trace providing a separate first signal path between one of said first connectors and one of said second connectors; and means for holding said DUT and for providing a separate second signal path between one of said second connectors and one of said DUT terminals.

7. The apparatus in accordance with claim 1 wherein each of said node cards comprises a substantially wedge-shaped printed circuit board having a first end and a second end, said first end being substantially narrower than said second end, said card frame holding each node card circuit board such that its first end is proximate to said focal point and such that its second end is distal from said focal point, and wherein said I/O terminal is mounted on said first end, and wherein said circuit means is mounted on said printed circuit board.

8. The apparatus in accordance with claim 1 wherein said card frame comprises:

an inner shell having a plurality of first apertures;

an outer shell partially surrounding said inner shell; and card guide means attached to said inner shell and said outer shell for holding the node cards substantially between said inner and outer shells with the I/O terminal of each of said node cards extending through one of said first apertures of said inner shell.

9. The apparatus in accordance with claim 8 wherein said inner shell and said outer shell are substantially hemispherical in shape.

10. The apparatus in accordance with claim 9 wherein said test head further comprises:

a load board means for holding said DUT, a plurality of load contacts mounted on said load board, a plurality of first contacts, each corresponding to a separate one of said I/O terminals;

a plurality of second contacts, each corresponding to a separate one of said first contacts;

a distributor shell, partially surrounded by said inner shell, for holding said plurality of first contacts and for holding each of said second contacts in contact with a separate one of said load contacts;

a plurality of conductors, each providing a signal path between a separate one of said first contacts and its corresponding second contact; and means for providing a signal path between a separate one of said load contacts and a corresponding one of said second contacts.

11. The apparatus in accordance with claim 10 wherein said means for providing a signal path between a separate one of said load contacts and a corresponding one of said second contacts comprises a plurality of pogo pins.

12. An apparatus for testing an integrated circuit device under test (DUT) having a plurality of DUT terminals by transmitting test signals to said DUT terminals and processing response signals produced by said DUT at said DUT terminals, the apparatus comprising:

a plurality of node cards, each node card corresponding to a separate one of said DUT terminals, each node card comprising an I/O terminal and circuit means connected to said I/O terminal for generating and transmitting a test signal from said I/O terminal and for receiving and processing a response signal arriving at said I/O terminal;

a card frame for holding said node cards such that their I/O terminals are radially distributed in three dimensions at points substantially equidistant from a focal point;

a centroid distributor comprising
a plurality of first contacts each positioned to contact an I/O terminal of a separate one of said node cards,
a plurality of second contacts, each corresponding to a separate one of said first contacts, and
a plurality of conductors, each for conveying signals between corresponding pairs of said first and second contacts; and signal routing means contacting each one of said second contacts and contacting each one of said DUT terminals, said signal routing means including a plurality of signal paths, each signal path conveying signals between a separate one of said DUT terminals and a corresponding one of said second contacts.

13. The apparatus in accordance with claim 12 wherein said centroid distributor further comprises:
a substantially hemispherical surface for holding said first terminals; and
a planar surface for holding said second terminals.

14. The apparatus in accordance with claim 12 wherein said centroid distributor is substantially in the shape of a hemisphere and comprises a plurality of distributor wedges, each distributor wedge comprising a shell having a curved surface for holding said first terminals and having a planar surface for holding said second terminals.

15. The apparatus in accordance with claim 14 wherein each of said distributor wedges further comprises insulating material substantially filling said shell.

16. The apparatus in accordance with claim 12 wherein said each of said plurality of conductors comprises a coaxial cable.

17. The apparatus in accordance with claim 12 wherein each of said node cards comprises a substantially wedge-shaped printed circuit board having a first end and a second end, said first end being substantially narrower than said second end, said card frame holding said circuit board such that its first end is proximate to said focal point and such that its second end is distal from said focal point, and wherein said I/O terminal is mounted on said first end, and wherein said circuit means is mounted on said printed circuit board.

18. The apparatus in accordance with claim 17 wherein said card frame comprises:
an inner shell partially surrounding said centroid distributor and having a plurality of first apertures;
an outer shell partially surrounding said inner shell; and
means for holding the circuit board of each node card substantially between said inner and outer shells with the I/O terminal of each of said node cards extending through a separate one of said apertures of said inner shell.

19. The apparatus in accordance with claim 12 wherein said centroid distributor comprises:
a load board for holding said DUT and for providing a plurality of load contacts, each load contact being conductively linked to a separate one of said DUT terminals;
a plurality of second terminals, each corresponding to a separate one of said first terminals;
a distributor shell, partially surrounded by the inner shell of said card frame, for holding said plurality of first terminals;
holding means attached to said distributor shell for holding each of said second terminals in contract with a separate one of said load contacts; and
a plurality of conductors, each providing a signal path between a separate one of said first terminals and its corresponding second terminal.

20. An apparatus for testing an integrated circuit device under test (DUT) having a plurality of DUT terminals by transmitting test signals to said DUT terminals and processing response signals produced by said DUT at said DUT terminals, the apparatus comprising:

a plurality of node cards, each node card comprising circuit means for generating at least one of said test signals and for receiving and processing at least one of said response signals produced by said DUT;

a card frame comprising an outer shell having a plurality of first apertures, an inner shell nested within and spaced apart from said outer shell having a plurality of second apertures, and card guide means for holding each node card substantially between said inner and outer shells;

an additional shell nested within and spaced apart from said inner shell thereby to form a first plenum therebetween;

a second plenum extending through said outer and inner shells; and an air pump attached to said second plenum for causing cooling air to flow through said first and second apertures, across said node cards, and through said first and second plenums.

21. The apparatus in accordance with claim 20 further comprising a cover shell substantially surrounding said outer shell of said card frame and containing third apertures through which said cooling air also flows.

22. The apparatus in accordance with claim 20 wherein said inner shell, said outer shell, and said additional shell are substantially hemispherical in shape.

23. The apparatus in accordance with claim 20 wherein said additional shell includes a plurality of first contacts mounted thereon and wherein each of said node cards includes an input output (I/O) terminal extending through one of said second apertures in said inner shell and contacting a corresponding one said plurality of contacts for conveying said test and response signals between said circuit means and the corresponding first contact.

24. The apparatus in accordance with claim 23 further comprising a plurality of conductive paths, each conductive path corresponding to a separate one of said first contacts, for conveying said test and response signals between the corresponding first contact and a separate one of said DUT terminals.

* * * * *